United States Patent
Goergen et al.

(10) Patent No.: US 11,683,190 B2
(45) Date of Patent: *Jun. 20, 2023

(54) WIRE FAULT AND ELECTRICAL IMBALANCE DETECTION FOR POWER OVER COMMUNICATIONS CABLING

(71) Applicant: CISCO TECHNOLOGY, INC., San Jose, CA (US)

(72) Inventors: Joel Richard Goergen, Soulsbyville, CA (US); Chad M. Jones, Doylestown, OH (US); Paolo Sironi, Gallarate (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/177,027

(22) Filed: Feb. 16, 2021

(65) Prior Publication Data

US 2021/0167976 A1    Jun. 3, 2021

Related U.S. Application Data

(63) Continuation of application No. 16/020,881, filed on Jun. 27, 2018, now Pat. No. 10,958,471.

(Continued)

(51) Int. Cl.
| | |
|---|---|
| *H04L 12/10* | (2006.01) |
| *H04L 12/40* | (2006.01) |
| *G01R 31/08* | (2020.01) |
| *G01R 31/58* | (2020.01) |
| *G01R 31/52* | (2020.01) |

(52) U.S. Cl.
CPC ............ *H04L 12/10* (2013.01); *G01R 31/083* (2013.01); *G01R 31/58* (2020.01); *H04L 12/40039* (2013.01); *H04L 12/40045* (2013.01); *G01R 31/52* (2020.01)

(58) Field of Classification Search
CPC .......... G06F 1/26; G06F 1/263; G06F 1/3212; G06F 1/3203; G06F 1/329; H04L 12/10; H04L 12/40039; H04L 12/40045
See application file for complete search history.

(56) References Cited

U.S. PATENT DOCUMENTS

| | | |
|---|---|---|
| 3,335,324 A | 8/1967 | Buckeridge |
| 4,811,187 A | 3/1989 | Nakajima |
| | (Continued) | |

FOREIGN PATENT DOCUMENTS

| | | |
|---|---|---|
| CN | 1209880 C | 7/2005 |
| CN | 101129019 A | 2/2008 |
| | (Continued) | |

OTHER PUBLICATIONS https://www.fischerconnectors.com/us/en/products/fiberoptic.
(Continued)

*Primary Examiner* — Raymond N Phan (57) ABSTRACT

In one embodiment, a method includes transmitting power in a power and data distribution system comprising at least two pairs of wires, negotiating a power level between Power Sourcing Equipment (PSE) and a Powered Device (PD) in the power and data distribution system, transmitting the power at a power level greater than 100 watts, periodically checking each of the wires for a fault, and checking for an electrical imbalance at the wires.

20 Claims, 10 Drawing Sheets

Related U.S. Application Data (60) Provisional application No. 62/653,385, filed on Apr. 5, 2018.

(56) References Cited

U.S. PATENT DOCUMENTS

| | | | |
|---|---|---|---|
| 5,652,893 A | 7/1997 | Ben-Meir |
| 6,008,631 A | 12/1999 | Johari |
| 6,220,955 B1 | 4/2001 | Posa |
| 6,259,745 B1 | 7/2001 | Chan |
| 6,636,538 B1 | 10/2003 | Stephens |
| 6,685,364 B1 | 2/2004 | Brezina |
| 6,826,368 B1 | 11/2004 | Koren |
| 6,855,881 B2 | 2/2005 | Khoshnood |
| 6,860,004 B2 | 3/2005 | Hirano |
| 7,325,150 B2 | 1/2008 | Lehr |
| 7,420,355 B2 | 9/2008 | Liu |
| 7,490,996 B2 | 2/2009 | Sommer |
| 7,492,059 B2 | 2/2009 | Peker |
| 7,509,505 B2 | 3/2009 | Randall |
| 7,566,987 B2 | 7/2009 | Black et al. |
| 7,583,703 B2 | 9/2009 | Bowser |
| 7,589,435 B2 | 9/2009 | Metsker |
| 7,593,747 B1 | 9/2009 | Karam |
| 7,603,570 B2 | 10/2009 | Schindler |
| 7,616,465 B1 | 11/2009 | Vinciarelli |
| 7,813,646 B2 | 10/2010 | Furey |
| 7,835,389 B2 | 11/2010 | Yu |
| 7,854,634 B2 | 12/2010 | Filipon |
| 7,881,072 B2 | 2/2011 | DiBene |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,068,937 B2 | 11/2011 | Eaves |
| 8,081,589 B1 | 12/2011 | Gilbrech |
| 8,184,525 B2 | 5/2012 | Karam |
| 8,276,397 B1 | 10/2012 | Carlson |
| 8,279,883 B2 | 10/2012 | Diab |
| 8,310,089 B2 | 11/2012 | Schindler |
| 8,319,627 B2 | 11/2012 | Chan |
| 8,345,439 B1 | 1/2013 | Goergen |
| 8,350,538 B2 | 1/2013 | Cuk |
| 8,358,893 B1 | 1/2013 | Sanderson |
| 8,638,008 B2 | 1/2014 | Baldwin et al. |
| 8,700,923 B2 | 4/2014 | Fung |
| 8,712,324 B2 | 4/2014 | Corbridge |
| 8,750,710 B1 | 6/2014 | Hirt et al. |
| 8,768,528 B2 | 7/2014 | Millar et al. |
| 8,781,637 B2 | 7/2014 | Eaves |
| 8,787,775 B2 | 7/2014 | Earnshaw |
| 8,829,917 B1 | 9/2014 | Lo |
| 8,836,228 B2 | 9/2014 | Xu |
| 8,842,430 B2 | 9/2014 | Hellriegel |
| 8,849,471 B2 | 9/2014 | Daniel |
| 8,966,747 B2 | 3/2015 | Vinciarelli |
| 9,019,895 B2 | 4/2015 | Li |
| 9,024,473 B2 | 5/2015 | Huff |
| 9,184,795 B2 | 11/2015 | Eaves |
| 9,189,036 B2 | 11/2015 | Ghoshal |
| 9,189,043 B2 | 11/2015 | Vorenkamp |
| 9,273,906 B2 | 3/2016 | Goth |
| 9,319,101 B2 | 4/2016 | Lontka |
| 9,321,362 B2 | 4/2016 | Woo |
| 9,373,963 B2 | 6/2016 | Kuznelsov |
| 9,419,436 B2 | 8/2016 | Eaves et al. |
| 9,510,479 B2 | 11/2016 | Vos |
| 9,531,551 B2 | 12/2016 | Balasubramanian |
| 9,590,811 B2 | 3/2017 | Hunter |
| 9,618,714 B2 | 4/2017 | Murray |
| 9,640,998 B2 | 5/2017 | Dawson |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes, Jr |
| 9,893,521 B2 | 2/2018 | Eaves |
| 9,948,198 B2 | 4/2018 | Imai |
| 9,979,370 B2 | 5/2018 | Xu |
| 9,985,600 B2 | 5/2018 | Xu |
| 10,007,628 B2 | 6/2018 | Pitigoi-Aron |
| 10,028,417 B2 | 7/2018 | Schmidtke |
| 10,128,764 B1 | 11/2018 | Vinciarelli |
| 10,248,178 B2 | 4/2019 | Brooks |
| 10,263,526 B2 | 4/2019 | Sandusky et al. |
| 10,407,995 B2 | 9/2019 | Moeny |
| 10,439,432 B2 | 10/2019 | Eckhardt |
| 10,468,879 B2 | 11/2019 | Eaves |
| 10,541,543 B2 | 1/2020 | Eaves |
| 10,714,930 B1 | 7/2020 | Weiss et al. |
| 10,735,105 B2 | 8/2020 | Goergen et al. |
| 10,958,471 B2 * | 3/2021 | Goergen ............. G01R 31/083 |
| 2001/0024373 A1 | 9/2001 | Cuk |
| 2002/0126967 A1 | 9/2002 | Panak |
| 2004/0000816 A1 | 1/2004 | Khoshnood |
| 2004/0033076 A1 | 2/2004 | Song |
| 2004/0043651 A1 | 3/2004 | Bain |
| 2004/0073703 A1 | 4/2004 | Boucher |
| 2005/0197018 A1 | 9/2005 | Lord |
| 2005/0268120 A1 | 12/2005 | Schindler |
| 2006/0202109 A1 | 9/2006 | Delcher |
| 2006/0209875 A1 | 9/2006 | Lum |
| 2007/0103168 A1 | 5/2007 | Batten |
| 2007/0236853 A1 | 10/2007 | Crawley |
| 2007/0263675 A1 | 11/2007 | Lum |
| 2007/0284946 A1 | 12/2007 | Robbins |
| 2007/0288125 A1 | 12/2007 | Quaratiello |
| 2008/0198635 A1 | 8/2008 | Hussain |
| 2008/0229120 A1 | 9/2008 | Diab |
| 2008/0238634 A1 | 10/2008 | Diab et al. |
| 2008/0310067 A1 | 12/2008 | Diab |
| 2009/0027033 A1 | 1/2009 | Diab |
| 2009/0195080 A1 * | 8/2009 | Diab ................. H04L 12/10 |
| | | | 307/113 |
| 2010/0077239 A1 | 3/2010 | Diab |
| 2010/0117808 A1 | 5/2010 | Karam |
| 2010/0171602 A1 | 7/2010 | Kabbara |
| 2010/0190384 A1 | 7/2010 | Lanni |
| 2010/0217447 A1 * | 8/2010 | Karam .................. H04L 12/10 |
| | | | 700/286 |
| 2010/0237846 A1 | 9/2010 | Vetteth |
| 2010/0290190 A1 | 11/2010 | Chester |
| 2011/0004773 A1 | 1/2011 | Hussain |
| 2011/0083824 A1 | 4/2011 | Rogers |
| 2011/0228578 A1 | 9/2011 | Serpa |
| 2011/0266867 A1 | 11/2011 | Schindler |
| 2011/0290497 A1 | 12/2011 | Stenevik |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0317426 A1 | 12/2012 | Hunter, Jr. et al. |
| 2012/0319468 A1 | 12/2012 | Schneider |
| 2012/0331315 A1 | 12/2012 | Diab |
| 2013/0077923 A1 | 3/2013 | Weem |
| 2013/0079633 A1 | 3/2013 | Weem |
| 2013/0103220 A1 | 4/2013 | Eaves |
| 2013/0127481 A1 * | 5/2013 | Vladan ................. G01R 27/16 |
| | | | 324/713 |
| 2013/0249292 A1 | 9/2013 | Blackwell, Jr |
| 2013/0272721 A1 | 10/2013 | Van Veen |
| 2014/0040641 A1 | 2/2014 | Diab |
| 2014/0111180 A1 | 4/2014 | Vladan |
| 2014/0129850 A1 | 5/2014 | Paul |
| 2014/0258742 A1 | 9/2014 | Chien |
| 2014/0265550 A1 | 9/2014 | Milligan |
| 2014/0372773 A1 | 12/2014 | Heath |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0215001 A1 | 7/2015 | Eaves |

(56) References Cited

U.S. PATENT DOCUMENTS

| | | |
|---|---|---|
| 2015/0215131 A1 | 7/2015 | Paul |
| 2015/0333918 A1 | 11/2015 | White, III |
| 2015/0340818 A1 | 11/2015 | Scherer |
| 2016/0020858 A1 | 1/2016 | Sipes, Jr. |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena |
| 2016/0133355 A1 | 5/2016 | Glew |
| 2016/0134331 A1 | 5/2016 | Eaves |
| 2016/0142217 A1 | 5/2016 | Gardner |
| 2016/0197600 A1 | 7/2016 | Kuznetsov |
| 2016/0197734 A1* | 7/2016 | Darshan .......... H04L 12/10 307/1 |
| 2016/0365967 A1 | 7/2016 | Tu |
| 2016/0241148 A1 | 8/2016 | Kizilyalli |
| 2016/0262288 A1 | 9/2016 | Chainer |
| 2016/0273722 A1 | 9/2016 | Crenshaw |
| 2016/0294500 A1 | 10/2016 | Chawgo et al. |
| 2016/0294568 A1 | 10/2016 | Chawgo et al. |
| 2016/0308683 A1 | 10/2016 | Pischl |
| 2016/0352535 A1 | 12/2016 | Hiscock |
| 2017/0041152 A1 | 2/2017 | Sheffield |
| 2017/0041153 A1 | 2/2017 | Picard |
| 2017/0054296 A1 | 2/2017 | Daniel |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0155518 A1 | 6/2017 | Yang |
| 2017/0164525 A1 | 6/2017 | Chapel |
| 2017/0214236 A1 | 7/2017 | Eaves |
| 2017/0229886 A1 | 8/2017 | Eaves |
| 2017/0234738 A1 | 8/2017 | Ross |
| 2017/0244318 A1 | 8/2017 | Giuliano |
| 2017/0248976 A1 | 8/2017 | Moller |
| 2017/0325320 A1 | 11/2017 | Wendt |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0063928 A1 | 3/2018 | Hick |
| 2018/0088648 A1 | 3/2018 | Otani |
| 2018/0098201 A1 | 4/2018 | Torello et al. |
| 2018/0102604 A1 | 4/2018 | Keith |
| 2018/0123360 A1 | 5/2018 | Eaves |
| 2018/0159430 A1 | 6/2018 | Albert |
| 2018/0188712 A1 | 7/2018 | MacKay |
| 2018/0191513 A1 | 7/2018 | Hess |
| 2018/0254624 A1 | 9/2018 | Son |
| 2018/0278488 A1 | 9/2018 | Kutty |
| 2018/0294636 A1 | 10/2018 | Lipke |
| 2018/0313886 A1 | 11/2018 | Mlyniec et al. |
| 2019/0190246 A1 | 6/2019 | Foster |
| 2019/0212713 A1 | 7/2019 | Bennett |
| 2019/0267804 A1 | 8/2019 | Matan |
| 2019/0280895 A1 | 9/2019 | Mather et al. |
| 2019/0363493 A1 | 11/2019 | Sironi |
| 2022/0032804 A1* | 2/2022 | Goergen .......... B60L 53/66 |
| 2022/0063429 A1* | 3/2022 | Goergen .......... H02J 7/04 |
| 2022/0190587 A1 | 6/2022 | Eaves et al. |

FOREIGN PATENT DOCUMENTS

| | | |
|---|---|---|
| CN | 201689347 U | 12/2010 |
| CN | 103597776 A | 2/2014 |
| CN | 204836199 U | 12/2015 |
| CN | 205544597 | 8/2016 |
| CN | 104081237 B | 10/2016 |
| CN | 104412541 B | 5/2019 |
| EP | 1936861 A1 | 6/2008 |
| EP | 2120443 A1 | 11/2009 |
| EP | 2693688 A1 | 2/2014 |
| JP | 2008529459 A | 7/2008 |
| JP | 2012003523 A | 1/2012 |
| JP | 2014225875 A | 12/2014 |
| WO | WO199316407 A1 | 8/1993 |
| WO | WO2010053542 | 5/2010 |
| WO | WO2017054030 | 4/2017 |
| WO | WO2017167926 | 10/2017 |
| WO | WO2018017544 A1 | 1/2018 |
| WO | WO2019023731 A1 | 2/2019 |

OTHER PUBLICATIONS http://www.strantech.com/products/tfoca-genx-hybrid-2x2-fiber-optic-copper-connector/.

http://www.qpcfiber.com/product/connectors/e-link-hybrid-connector/.

https://www.lumentum.com/sites/default/files/technical-library-items/poweroverfiber-tn-pv-ae_0.pdf.

"Network Remote Power Using Packet Energy Transfer", Eaves et al., www.voltserver.com, Sep. 2012.

Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.

Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.

Yencheck, Thermal Modeling of Portable Power Cables, 1993.

Zhang, Machine Learning-Based Temperature Prediction for Runtime Thermal Management across System Components, Mar. 2016.

Data Center Power Equipment Thermal Guidelines and Best Practices.

Dynamic Thermal Rating of Substation Terminal Equipment by Rambabu Adapa, 2004.

Chen, Real-Time Temnperature Estimation for Power MOSEFETs Conidering Thermal Aging Effects:, IEEE Trnasactions on Device and Materials Reliability, vol. 14, No. 1, Mar. 2014.

English Translation of Office Action in counterpart Chinese Application No. 201980022938.4, dated Nov. 15, 2021, 24 pages.

Examination Report in counterpart European Patent Application No. 19716263.9, dated Jul. 13, 2021, 8 pages.

International Search Report and Written Opinion in counterpart International Application No. PCT/US2019/023468, dated May 17, 2019, 11 pages.

Examination Report in counterpart Indian Application No. 202027034401, dated Aug. 23, 2022, 7 pages.

Notification of Registration and Granting a Patent Right in counterpart Chinese Application No. 201980022938.4, dated Jul. 20, 2022, 8 pages.

*Voltserver Inc.*, v. *Cisco Technology, Inc.*, "Decision Denying Institution of Post-Grant Review," United States Patent and Trademark Office, PGR2021-00055, U.S. Pat. No. 10,735,105 B2, Aug. 19, 2021, 25 pages.

*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00055, U.S. Pat. No. 10,735,105, 2021, Jun. 2, 2021, 51 pages.

"Effects of current on human beings and livestok—Part 1: General aspects," Technical Specification, Basic Safety Publication, IEC/TS 60479-1, Edition 4.0, Jul. 2005, 122 pages.

"Information technology equipment—Safety—Part 1: General requirements," International Standard, IEC 60950-1, Edition 2.2, May 2013, pp. 1-61, 63 pages.

"Information technology equipment—Safety—Part 1: General requirements," International Standard, IEC 60950-1, Edition 2.2, May 2013, pp. 62-122, 61 pages.

"Information technology equipment—Safety—Part 1: General requirements," International Standard, IEC 60950-1, Edition 2.2, May 2013, pp. 123-181, 59 pages.

"Information technology equipment—Safety—Part 1: General requirements," International Standard, IEC 60950-1, Edition 2.2, May 2013, pp. 182-253, 72 pages.

(56) References Cited

OTHER PUBLICATIONS

"Information technology equipment—Safety—Part 1: General requirements," International Standard, IEC 60950-1, Edition 2.2, May 2013, pp. 254-319, 66 pages.
"Information technology equipment—Safety—Part 1: General requirements," International Standard, IEC 60950-1, Edition 2.2, May 2013, pp. 320-377, 58 pages.
"Information technology equipment—Safety—Part 1: General requirements," International Standard, IEC 60950-1, Edition 2 2, May 2013, pp. 378-433, 56 pages.
"Information technology equipment—Safety—Part 1: General requirements," International Standard, IEC 60950-1, Edition 2.2, May 2013, pp. 434-490, 57 pages.
"Information technology equipment—Safety—Part 1: General requirements," International Standard, IEC 60950-1, Edition 2.2, May 2013, pp. 491-551, 61 pages.
"Information technology equipment—Safety—Part 1: General requirements," International Standard, IEC 60950-1, Edition 2.2, May 2013, pp. 552-622, 71 pages.
"Information technology equipment—Safety—Part 1: General requirements," International Standard, IEC 60950-1, Edition 2.2, May 2013, pp. 623-644, 24 pages.
"Low-voltage switchgear and controlgear—Part 1: General rules," International Standard, Amendment 2, IEC 60947-1, Edition 5.0, Sep. 2014, pp. 1-63, 65 pages.
"Low-voltage switchgear and controlgear—Part 1: General rules," International Standard, Amendment 2, IEC 60947-1, Edition 5.0, Sep. 2014, pp. 64-102, 41 pages.
Stephen Edelstein, "Updated 2016 Tesla Model S also gets new 75-kWh battery option," Internet Archive WayBack Machine, Green Car Reports, May 5, 2016, 3 pages.
Stephen S. Eaves, "Network Remote Powering using Packet Energy Transfer," IEEE Xplore, Proceedings of IEEE International Conference on Telecommunications Energy (INTELEC) 2012, 978-1-4673-1000, Sep. 30-Oct. 4, 2012, 4 pages.
"Audio/video, information and communication technology equipment—Part 1: Safety requirements," International Standard, IEC 62368-1, Edition 2.0, Feb. 2014, pp. 1-132, 134 pages.
"Audio/video, information and communication technology equipment—Part 1: Safety requirements," International Standard, IEC 62368-1, Edition 2.0, Feb. 2014, pp. 133-263, 131 pages.
"Audio/video, information and communication technology equipment—Part 1: Safety requirements," International Standard, IEC 62368-1, Edition 2.0, Feb. 2014, pp. 264-387, 124 pages.
"Audio/video, information and communication technology equipment—Part 1: Safety requirements," International Standard, IEC 62368-1, Edition 2.0, Feb. 2014, pp. 388-508, 121 pages.
"Audio/video, information and communication technology equipment—Part 1: Safety requirements," International Standard, IEC 62368-1, Edition 2.0, Feb. 2014, pp. 509-593, 85 pages.
"Audio/video, information and communication technology equipment—Part 1: Safety requirements," International Standard, IEC 62368-1, Edition 2.0, Feb. 2014, pp. 594-676, 85 pages.
"National Electrical Code," National Fire Protection Association (NFPA) 70, 2017, 881 pages.
*Voltserver Inc.*, v. *Cisco Technology, Inc.*, "Declaration of David A. Durfee, Ph.D.," United States Patent and Trademark Office, PGR2021-00055, U.S. Pat. No. 10,735,105, Feb. 16, 2021, 340 pages.
David A. Durfee Ph.D., "Curriculum Vitae," 4 pages.
Adel S. Sedra, "Microelectronic Circuits," Sedra/Smith, Oxford University Press, Seventh Edition, 2015, 38 pages.
Charles k. Alexander, et al., "Fundamentals of Electric Circuits," McGraw Hill Education, Indian Edition 5e, 2013, 37 pages.
Andrew S. Tanenbaum, "Computer Networks," Prentice Hall PTR, Third Edition, 1996, 12 pages.
William Stallings, "Data and Computer Communications," Macmillan Publishing Company, Fourth Edition, 1994, 14 pages.
B.P. Lathi, et al., "Modem Digital and Analog Communication Systems," Oxford University Press, Fourth Edition, 2009, 15 pages.
*Voltserver Inc.*, v. *Cisco Technology, Inc.*, "Petition for Post Grant Review of U.S. Pat. No. 10,735,105," United States Patent and Trademark Office, PGR2021-00055, U.S. Pat. No. 10,735,105, Feb. 16, 2021, 132 pages.
Stephen H. Hall, et al., "High-Speed Digital System Design: A handbook of Interconnect Theory and Design Practices,", John Wiley & Sons, Inc., 2000, 55 pages.
"Understanding 802.3at, PoE Plus Standard Increases Available Power," Microsemi, Jun. 2011, 7 pages.
"Digital Electricity Gen2 Detailed Installation Manual," Voltserver Digital Electricity, Rev B.1, Nov. 29, 2017, 68 pages.
Berkeley Lab ETA, "Touch-Safe, High Voltage Digital Electricity Transmission using Packet Energy Transfer," Vimeo, https://vimeo.com/172469008, Mar. 8, 2016, 8 pages.
*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.
*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00056, U.S. Pat. No. 10,735,105, 2021, Jun. 2, 2021, 46 pages.
*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.
"Electrical—Computer Conference Proceedings," Internet Archive WayBack Machine Search for Intelec 2012, Curran Associates, Inc., http://www.proceedings.com/electrical-computer-proceedings.html, 2012, 125 pages.
"Part VII: A Summary of Commonly Used MARC 21 Fields," Marc, Understanding MARC, https://www.loc.gov/marc//umb/um07to10.html, retrieved from Internet Feb. 13, 2021, 17 pages.
LC Catalog-Browse, https://catalog.loc.gov/vwebv/searchBrowse, retrieved from the Internet Feb. 12, 2021, 1 page.
"International Telecommunications Energy Conference: [proceedings] (Marc Tags)," Library Catalog, https://catalog.loc.gov/vwebv/staffView?searchId=3877&recPointer=0&recCount=25&searchType=1&bibId=11348322, retrieved from the Internet Feb. 12, 2021, 3 pages.
*Voltserver Inc.*, v. *Cisco Technology, Inc.*, "Petition for Post Grant Review of U.S. Pat. No. 10,735,105," United States Patent and Trademark Office, PGR2021-00056, U.S. Pat. No. 10,735,105, Feb. 16, 2021, 116 pages.
"International Telecommunications Energy Conference: [proceedings] (Full Record)," Library Catalog, https://catalog.loc.gov/vwebv/holdingsinfo?searchId=3810&recPointer=0&recCount=25&searchType=1&bibId=11348322, retrieved from the Internet Feb. 12, 2021, 4 pages.
English Translation of Office Action in counterpart Japanese Application No. 2020-554252, dated Nov. 7, 2022, 13 pages.

\* cited by examiner

WIRE FAULT AND ELECTRICAL IMBALANCE DETECTION FOR POWER OVER COMMUNICATIONS CABLING

STATEMENT OF RELATED APPLICATIONS

The present application is a continuation of U.S. patent application Ser. No. 16/020,881, entitled "METHOD AND APPARATUS FOR DETECTING WIRE FAULT AND ELECTRICAL IMBALANCE FOR POWER OVER COMMUNICATIONS CABLING", filed Jun. 27, 2018, which claims priority from U.S. Provisional Application No. 62/653,385, entitled WIRE FAULT AND PAIR UNBALANCE DETECTION FOR POWER OVER COMMUNICATIONS CABLING, filed on Apr. 5, 2018. The contents of these applications are incorporated herein by reference in their entirety.

TECHNICAL FIELD

The present disclosure relates generally to communications networks, and more particularly, to safety features for power over communications systems.

BACKGROUND

Power over Ethernet (PoE) is a technology for providing electrical power over a wired telecommunications network from power sourcing equipment (PSE) to a powered device (PD) over a link section. In conventional PoE systems that use 100 W or less power sources, significant protection mechanisms are not needed because the limited power system classification does not cause destructive damage or life safety concerns. In newer systems that may exceed the 100 W threshold, it is important to define safety protocol mechanisms that protect both the system and the user.

BRIEF DESCRIPTION OF THE DRAWINGS

Corresponding reference characters indicate corresponding parts throughout the several views of the drawings.

DESCRIPTION OF EXAMPLE EMBODIMENTS

Overview

In one embodiment, a method generally comprises transmitting Power over Ethernet (PoE) in a PoE distribution system at a power greater than 100 watts, the distribution system comprising at least two pairs of wires, monitoring a thermal condition in the distribution system, periodically checking each of the wires for a fault, and checking for an electrical imbalance at the wires.

In another embodiment, an apparatus generally comprises a route processor operable as a power source in a Power over Ethernet (PoE) distribution system, the route processor comprising, a plurality of ports for delivering power to a plurality of powered devices, and a fault detection module for monitoring a thermal condition in the distribution system, checking wires at each of the ports for a fault, and checking for an electrical imbalance at the wires.

In yet another embodiment, a modular transport system generally comprises a route processor comprising a plurality of ports for delivering Power over Ethernet (PoE) at a power greater than 100 watts, a plurality of powered devices comprising a plurality of ports for receiving the PoE, and a fault detection system for monitoring a thermal condition in the distribution system, checking wires at each of the ports for a fault, and checking for an electrical imbalance at the wires.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

The maximum power delivery capacity of standard Power over Ethernet (PoE) is approximately 100 watts (W), but many classes of powered devices would benefit from power delivery of greater than 100 W. For PoE applications exceeding 100 W, there is a need for safety mechanisms to protect users and property.

The embodiments described herein provide safety systems and methods that allow for delivery of higher wattage power over communications cabling to safely deliver power exceeding 100 W for higher ampacity applications beyond conventional 90 W PoE implementations. The safety system may, for example, prevent unwanted electrical events such as shorts, opens, electrical imbalance, exceeding ampacity limits, or life safety concerns. In one example, the system may allow for a safe implementation of up to 300 watts of power delivered over a four-pair communications cable. The system may, for example, deliver 100 W-300 W power at a cable distance up to 15 meters. As described in detail below, the embodiments may be implemented in a transport router with a RP (Route Processor) control plane in a separate system from line card optics. Both power and data are passed from the RP device to the line card device in a PSE (Power Sourcing Equipment) to PD (Powered Device) application.

Figure 1:
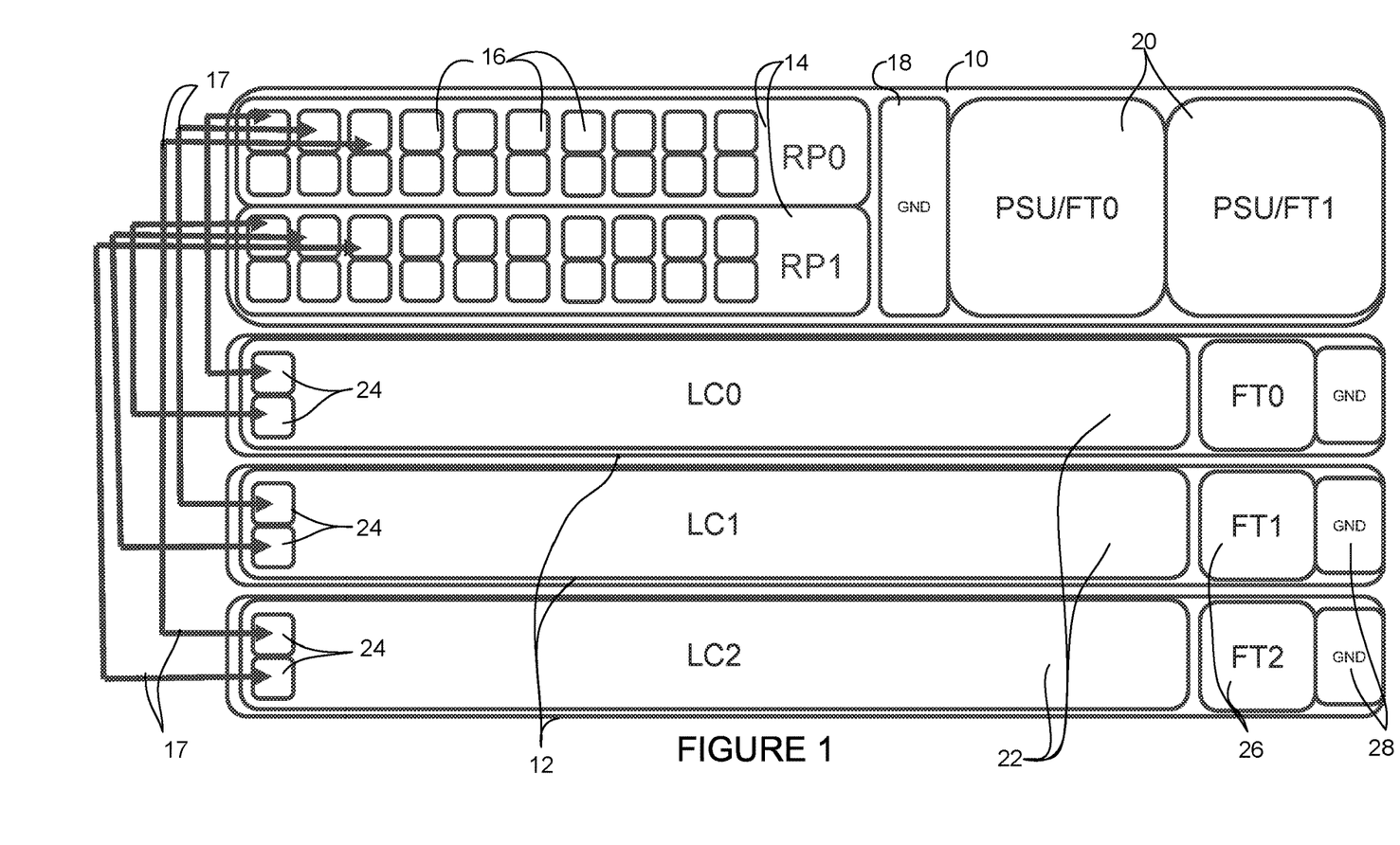
FIG. 1 illustrates an example of a system in which embodiments described herein may be implemented.

Referring now to the drawings, and first to FIG. 1, an example of a modular transport system that may utilize power over communications cabling (also referred to herein as enhanced PoE) for power distribution. The modular transport system shown in FIG. 1 includes a dual route processor (RP) card chassis 10 supplying control and power to three line card chassis 12. The dual RP card chassis may be, for example, a 2 RU (rack unit) chassis. The route processor card chassis 10 comprises two route processors 14 (RP0, RP1), each comprising twenty downlink ports 16, a dual port ground system 18, and two combination power supply unit (PSU) and fan tray modules 20 (PSU/FT0, PSU/FT1). The scalable transport system may support, for example, up to twenty redundant line card connections or eighteen line card connections and two fabric connections. Each downlink port 16 may support, for example, integrated 1 Gb/s or 10 Gb/s with a 300 W power system. The downlink ports 16 supply control and power to each line card chassis 12 (or fabric chassis). In one example, the power supply units 20 provide dual 2 kW AC or DC (or other power level) redundant power modules (1+1). Each line card chassis 12 comprises a line card 22 (LC0, LC1, LC2) comprising dual uplink ports 24, fan tray 26 (FT0, FT1, FT2), and a ground system 28. Power and data are transmitted from ports 16 at the route processors 14 to the ports 24 at the line cards 22 via cables 17. In this example, the route processor 14 is the PSE (Power Sourcing Equipment) and the line cards 22 are the PDs (Powered Devices) in the PoE distribution system.

In one embodiment, the ports 16, 24 comprise interconnect ports that combine data and PoE utilizing an RJ45 (or similar connector). For example, the cable and connector system may comprise RJ45 cat7 style, 4 pair communications cabling. The ports 16, 24 may be labeled to identify capability for power over 90 W. In one example, the cable and connector system may support ampacity per pin or wire to 2000 ma, minimum. For example, 22 AWG (American Wire Gauge) wire may be used to support 1500 ma-2000 ma per wire in a cat7/cat5e cable system. In one example, the system may support a cable length of up to 15 meters (based on technology of cat7 cable, 22 AWG at 300 W). In one or more embodiments, the internal PSE power supply voltage may operate in the 56V to 57V range, 57V to 58V range, or 56V to 58V range. For example, the output voltage at the PSE may be 57V with an input voltage at the PD of 56V. For a 15 meter cable, a 56V power supply at the PSE can deliver approximately 300 W power. With less current, the system may also deliver power less than 300 W to lengths beyond 15 meters, for example.

It is to be understood that the arrangement shown in FIG. 1 is only an example, and other arrangements (e.g., number of route processors, PSUs, line cards, or uplinks/downlinks) may be used without departing from the scope of the embodiments. Furthermore, the connectors, cables, cable lengths, and power ranges described herein are only examples and that other types of connectors, length of cables, type of cable systems, or power levels may be used without departing from the scope of the embodiments.

Figure 2:
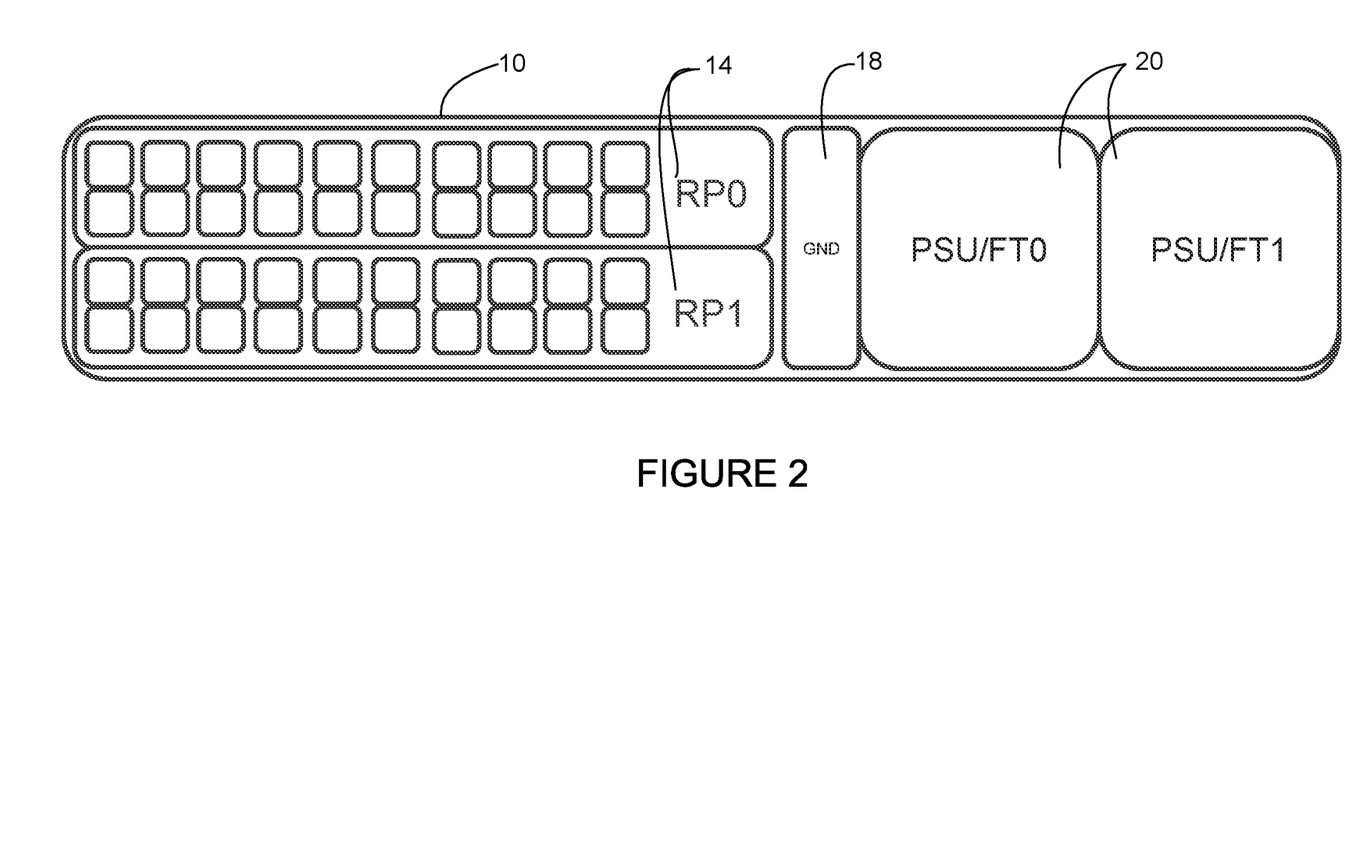
FIG. 2 is a front view of a dual route processor card chassis.
Figure 3:
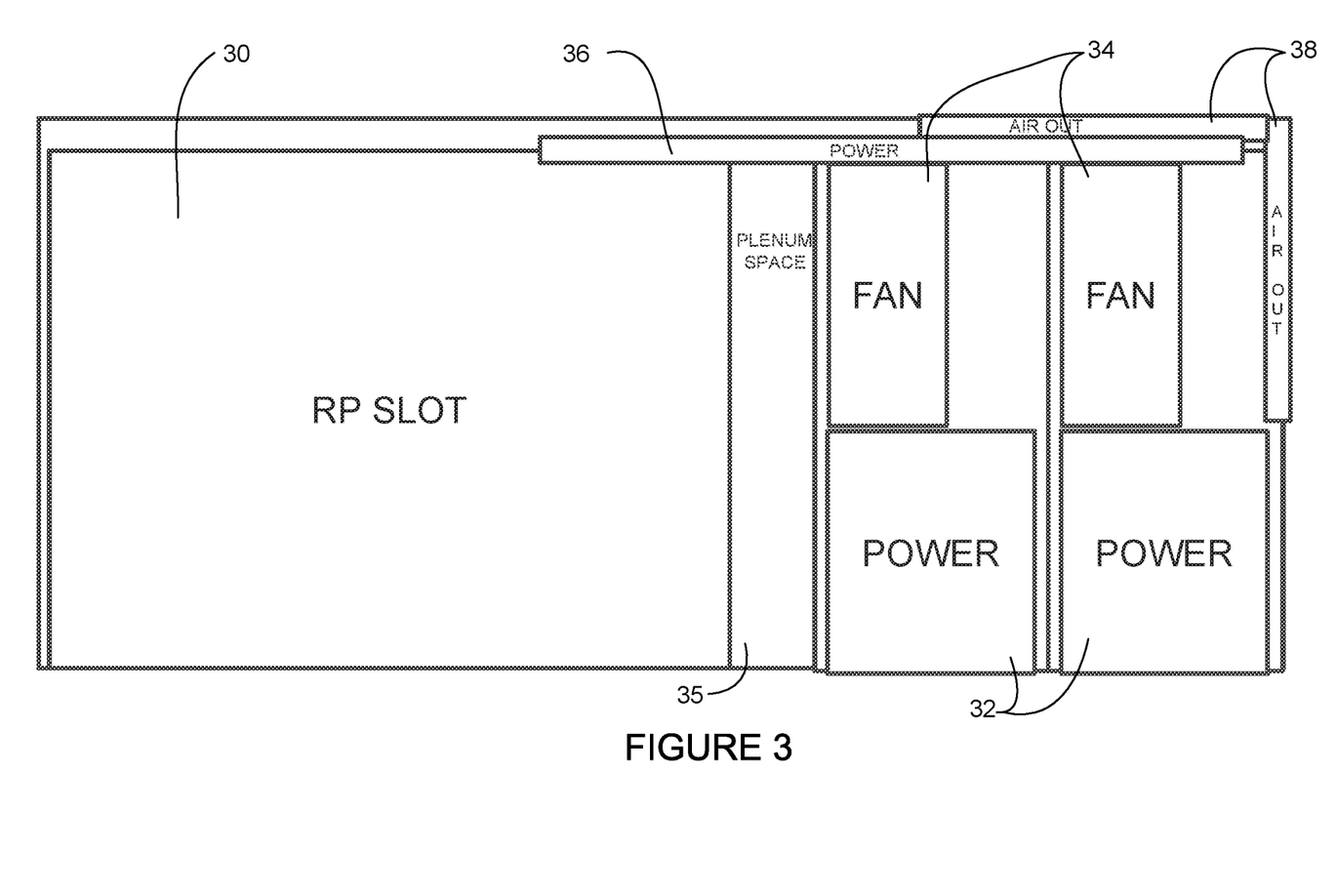
FIG. 3 is a top view of the chassis shown in FIG. 2.

FIG. 2 shows the dual RP card chassis 10 without the line card connections shown in FIG. 1, and FIG. 3 is a top view of the dual route processor card chassis shown in FIG. 2. The route processors 14 are contained within a route processor (RP) slot 30 (FIG. 3). Power supply units 32 are positioned in front of fans 34. A plenum space 35 is interposed between the combined power and fan modules and the RP slot 30. Routing of power is shown at 36 and air passages are depicted at 38.

Figure 4:
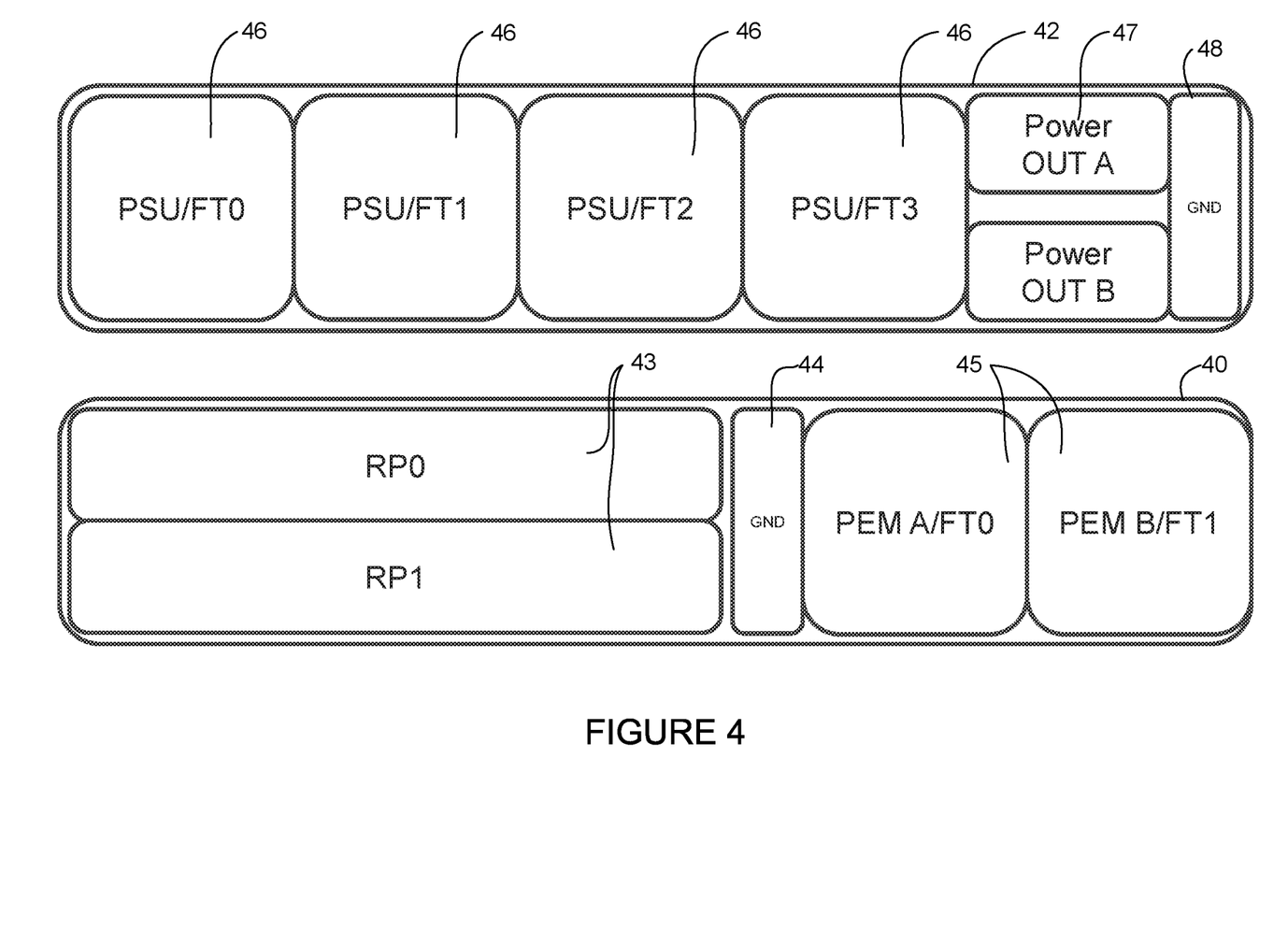
FIG. 4 illustrates a dual route processor chassis with an extended power shelf.

FIG. 4 illustrates a front view of a dual route processor chassis 40 and an extended power system (shelf) 42. The extended power system 42 may be used, for example, to supply four 2 kW redundant power modules (2+2) (e.g., double the delivered power capacity of the RP chassis 10 shown in FIG. 1). The RP chassis 40 includes route processors 43 (RP0, RP1), ground system 44, and combined PEM (Power Entry Module) and fan tray 45 (PEM A/FT0, PEM B/FT1. In this example, the extended power shelf 42 includes four combined power supply units and fan trays 46 (PSU/FT0, PSU/FT1, PSU/FT2, PSU/FT3) and ground system 48. Power is supplied to the route processors 43 via two power outputs 47 (power OUT A, power OUT B). The route processor card chassis 40 receives power at the PEMs 45 and delivers power at downlink ports (not shown) as previously described with respect to FIG. 1.

Figure 5A:
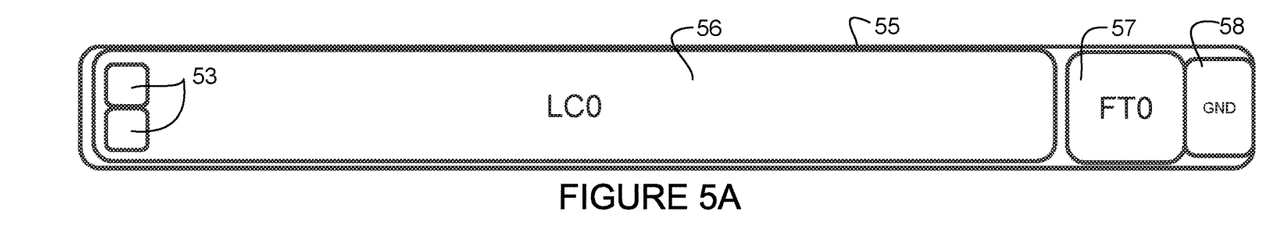
FIG. 5A is a front view of a line card chassis.
Figure 5B:
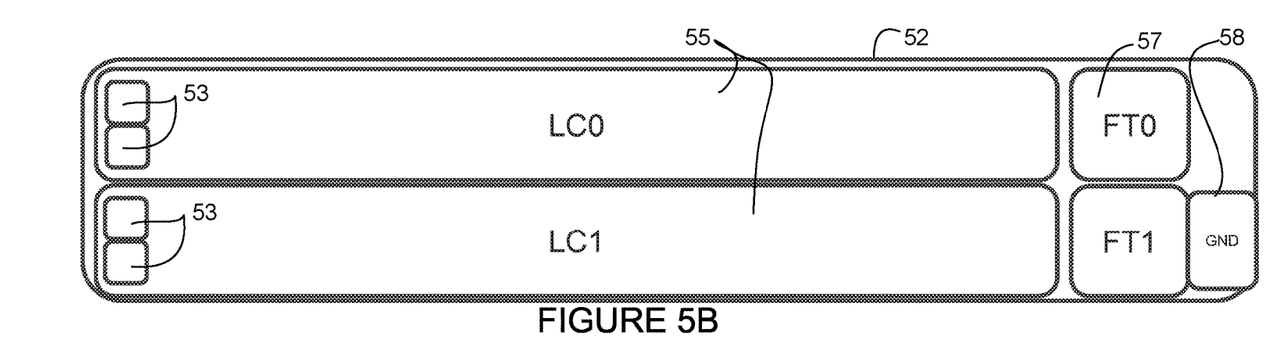
FIG. 5B is a front view of a dual line card chassis.
Figure 5C:
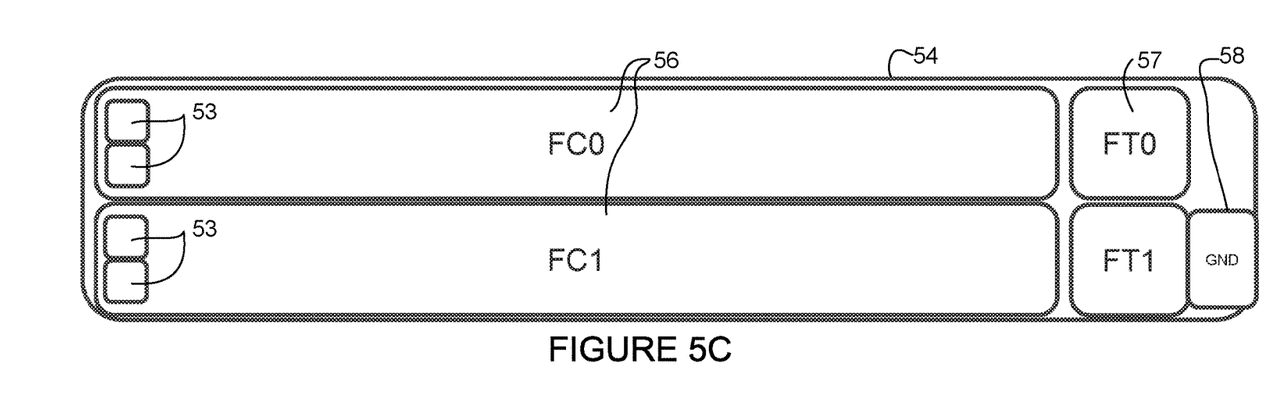
FIG. 5C is a front view of a dual fabric chassis.

FIGS. 5A, 5B, and 5C illustrate a line card chassis 50, dual line card chassis 52, and dual fabric card chassis 54, respectively. Each line card (LC0, LC1) 55 and fabric card (FC0, FC1) 56 may support, for example, dual uplink ports 53 with 300 W power. Each line card 55 and fabric card 56 has a corresponding fan tray (FT0, FT1) 57 and each chassis 50, 52, 54 includes a ground 58. The dual fabric chassis 54 may support multiple line card chassis.

It is to be understood that the components and arrangements shown in FIGS. 1, 2, 3, 4, 5A, 5B, and 5C are only examples of modular transport systems that may utilize the safety systems described herein for power over communications cable systems.

As previously described, higher power PoE distribution systems (e.g., ≥100 W PoE) present a need for additional fault detection to safely protect equipment and users. The following describes a fault detection system and method that may be implemented on the modular transport systems described above with respect to FIGS. 1-5C or other transport systems configured for power over communications cabling (e.g., PoE above 100 W, between 100 W and 300 W, approximately 300 W). The fault detection (safety) system and method described herein may be used, for example, to prevent thermal buildup on a multi-pair cable system, wire-to-wire imbalance across a pair of wires, pair-to-pair imbalance, short circuit, or any combination thereof. As described below, thermal buildup may be detected by monitoring the current in a wire and calculating a change in temperature for a wire, wire pair, cable (e.g., four-pair cable) based on known wire parameters. A wire-to-wire imbalance may be detected across a pair if one of the two wires in a pair carries substantially more current than the other. A pair-to-pair imbalance may be detected if one of the pairs carries substantially more current than the other pairs. Each wire may also be evaluated to identify a short circuit or fault. An error or a minor or major alarm may be generated if a fault is detected. Depending on the severity of the detected fault, the power may be reduced or the port may be shutdown. For example, if the thermal buildup is minor, power may be reduced to reduce current on the line. If a short or other fault is detected on the wire or an electrical imbalance is detected, the corresponding port may be shutdown.

Figure 6:
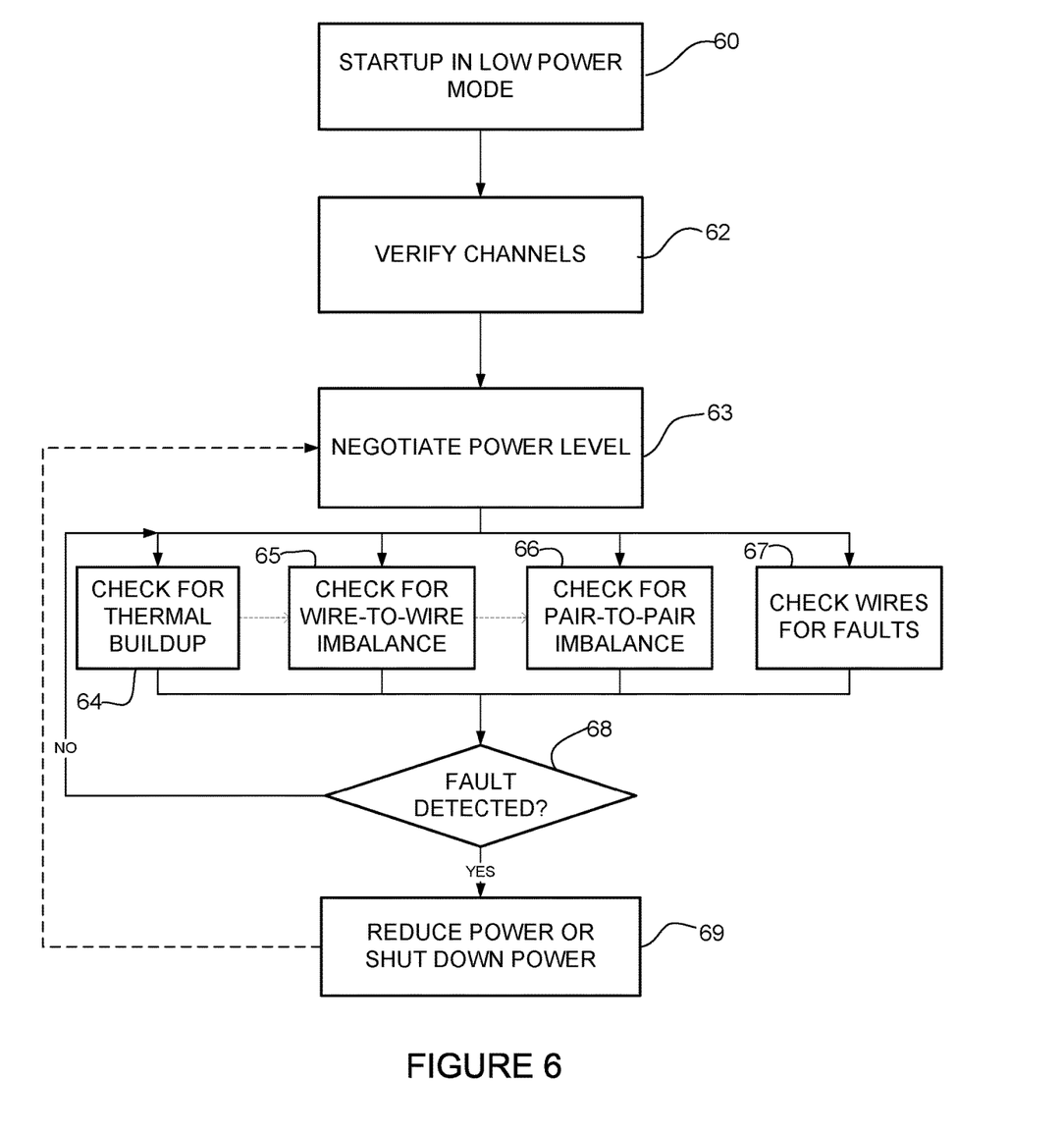
FIG. 6 is a flowchart illustrating a process for wire fault and electrical imbalance detection, in accordance with one embodiment.

FIG. 6 is a flowchart illustrating an overview of a process for detecting faults in the power over communications cabling system, in accordance with one embodiment. At step 60, the system starts up in a low power mode (e.g., ≤90 W or other low power setting) using, for example, IEEE standard 802.3bt for Power over Ethernet (e.g., class 8). A channel verification algorithm may be performed to evaluate links before applying power (step 62). For example, a monitoring process may roll through the wires to verify wire connectivity. The system may then use CDP (Cisco Discovery Protocol) (or any other suitable protocol) to negotiate for power above 90 W, in a similar manner that UPoE (Universal Power over Ethernet) negotiates up to 60 W from a 15 W or 30 W start (step 63). In one example, the PSE may inform the PD of a power level that the PSE is capable of providing and the PD may then select the appropriate power level to use. The PSE and PD may negotiate power levels, for example, of 15 W, 30 W, 60 W, 90 W, 150 W, 200 W, 250 W, 300 W, or any other suitable power level. If no faults are detected, the system may auto negotiate to maximum available power. Ethernet management packets may be used to enable allocation to 300 W maximum power, for example.

Once the power is increased, fault detection is performed, as described in detail below. Fault detection may include for example, a check for thermal buildup (step 64), electrical imbalance check (wire-to-wire imbalance check (step 65), pair-to-pair imbalance check (step 66)), or short circuit/fault protection check (step 67). The system may be configured to perform one or more of these checks in any order (as indicated in one example by dashed lines between steps in FIG. 6) or some steps may be performed simultaneously. One or more of the safety checks may be performed continuously or at specified intervals. For example, the wires may be monitored one by one in a continuous loop within a 10 ms window. If a fault is detected or a specified PSE voltage (e.g., 58.5V) is exceeded, power output is shutdown (steps 68 and 69). If the fault is minor (e.g., one or more parameters close to limit but not exceeding limit), power may be reduced through renegotiation of the power level. If the fault continues, the port may then be shutdown. An alarm may also be generated. In one or more embodiments, packet and idle (link) monitoring may be used to shut down the power. If a wire is lost, the link is lost and per wire faults are covered.

It is to be understood that the process shown in FIG. 6 and described above is only an example and that steps may combined, added, removed, or modified, without departing from the scope of the embodiments.

The following describes details of safety checks (fault detection) that may be performed for steps 64-67 of FIG. 6.

In one or more embodiments, thermal buildup may be detected by tracking cable current change and calculating cable current temperature. The cable temperature is a function of amperage, cable gauge, and length of cable. By using known parameters and assuming a wire size (e.g., 22 AWG), the temperature limit of the cable in a bundle environment may be calculated. Temperature ranges may be defined, for example, as normal, minor, major, and critical (e.g., minor defined within 20 C.° of cable temperature limit, major defined within 10 C.° of cable temperature limit, and critical defined at cable temperature limit). If the temperature range is in the minor range, the system may force renegotiation of power to reduce current on the line. If the temperature is in the critical range, the port may be de-energized. The temperature may be calculated in each wire, each pair of wires, the four-pair cable, or any combination. Thermal modeling of the cable may be performed as described in U.S. patent application Ser. No. 15/604,344, entitled "Thermal Modeling for Cables Transmitting Data and Power", filed May 24, 2017, for use in fault detection, for example.

Action may also be taken based on the monitored (or calculated) current. For example, if the current in the cable exceeds the cable current maximum limit, the port may be shutdown. If the cable current reaches a specified range, the line card (PD) may be forced to perform power negotiation with the PSE to reduce current on the line. The current may be monitored per wire, per pair of wires, per cable, or any combination. Current ranges may be defined as normal, minor, major, and critical (e.g., minor defined within 20% maximum current, major defined within 10% maximum current, and critical defined at maximum current). If the range is minor, renegotiation may be performed to reduce current on the cable. If the critical current is reached, the port may be de-energized.

As shown in steps 65 and 66 of FIG. 6, a fault may be identified based on electrical imbalance. Wire-to-wire imbalance (between wires within a pair of wires) and pair-to-pair imbalance (between pairs of wires) may be tracked. An alarm may be generated if wire-to-wire or pair-to-pair imbalance exceeds a specified limit. Cable degradation may also be tracked and a minor alarm generated upon detection of a wire-to-wire or pair-to-pair imbalance. An example of a pair-to-pair imbalance detection circuit is shown in FIG. 7 for a PSE and FIG. 8 for a PD and described below.

In one or more embodiments, a fault detection circuit provides per pair fault and imbalance detection in a four-pair communications cable (e.g., cable comprising at least two pairs of wires). The fault detection circuit individually monitors and looks for current disparity, examines live load to negotiated load, and considers automatic load leveling across wires for impedance changes. Per wire faults may be detected using a center tap and link monitor.

Figure 7:
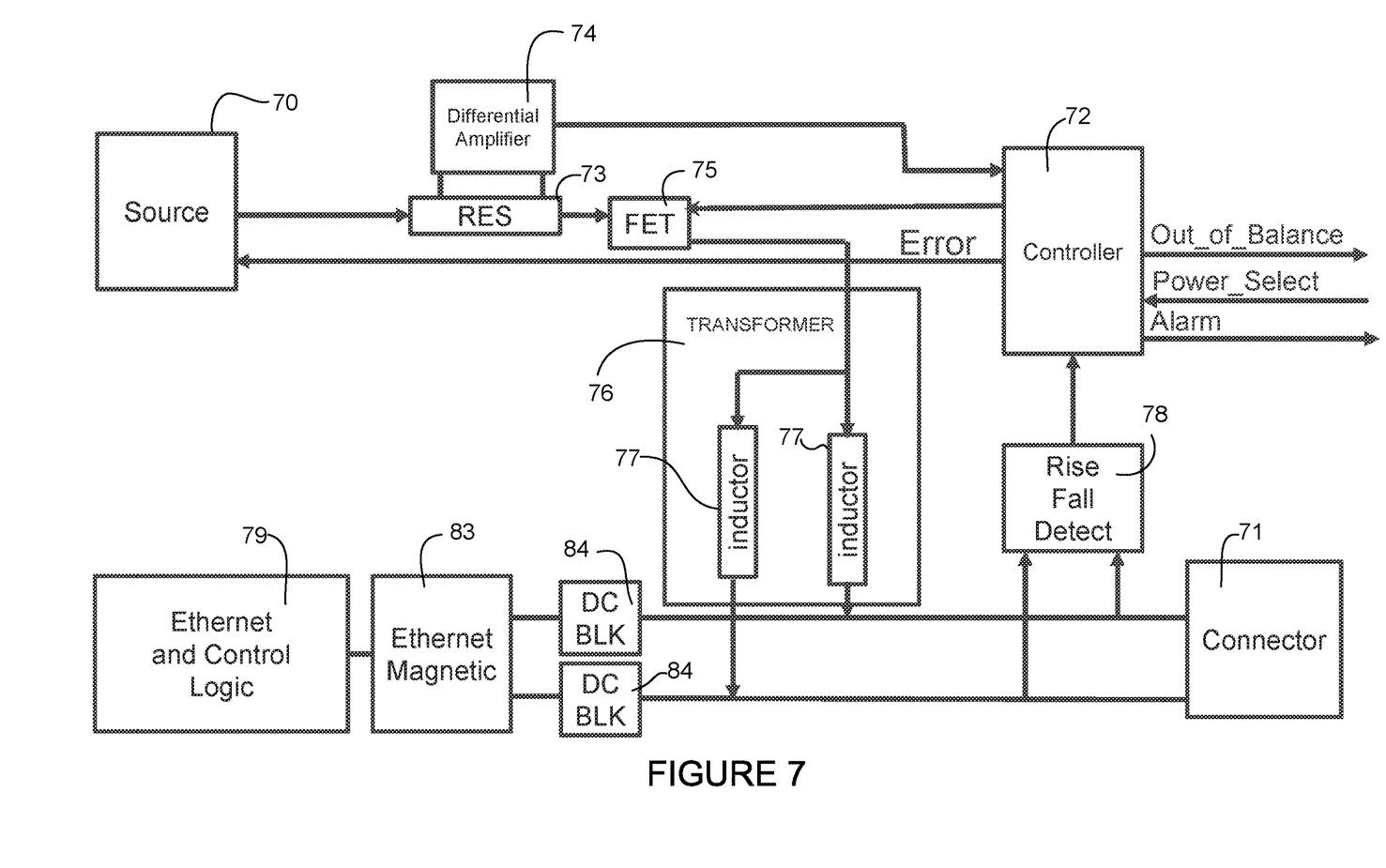
FIG. 7 is a block diagram of an electrical imbalance detection circuit for a power source, in accordance with one embodiment.

FIG. 7 illustrates an example of a fault detection circuit for per pair fault and imbalance detection at a PoE source, in accordance with one embodiment. The fault detection is performed for each port (e.g., port 16 at route processor 14 in FIG. 1) at the PSE source. For simplification the circuit is shown for one of the four-pairs of wires at one of the ports. A circuit is provided for fault detection for each pair of wires. The circuit shown in FIG. 7 is located at the PSE (route processor 14 in FIG. 1) and provides a check from a power source 70 to a connector 71 at the port. The source 70 may provide, for example, 58 VDC, or other suitable power level, as previously described. The connector 71 may comprise, for example, an RJ45 connector for providing power and data over a cable to the powered device (e.g., line card 22 in FIG. 1).

A microcontroller 72 (e.g., PIC (Programmable Interface Controller)) may be used to compare all four pairs and provide an indication of an out of balance condition or fault and initiate an alarm. The power passes from the source 70 through resistor 73, which is in communication with a differential amplifier 74. The circuit includes a field effect transistor (FET) 75 receiving input from the source 70 (via the resistor 73) and the controller 72, and providing input to a transformer 76 comprising a pair of inductors 77. Power is transmitted to the connector 71 from the transformer 76. The controller 72 also receives input from a rise and fall detector 78 tapped into Ethernet lines. Ethernet data and control logic is provided by module 79. The Ethernet circuit includes Ethernet magnetics 83 and DC blocks 84.

In order to avoid the use of large magnetics to handle both data and power, the system may use passive coupling instead of integrated magnetics for data transfer. The system uses AC coupling instead of passing through the Ethernet magnetics 79. This avoids the use of large magnetics to handle both data and power. Capacitors may be used to block the DC power from the Ethernet magnetics to prevent a short. In one example, capacitors are used inline and inductors are used to deliver power with matched power inductors.

Figure 8:
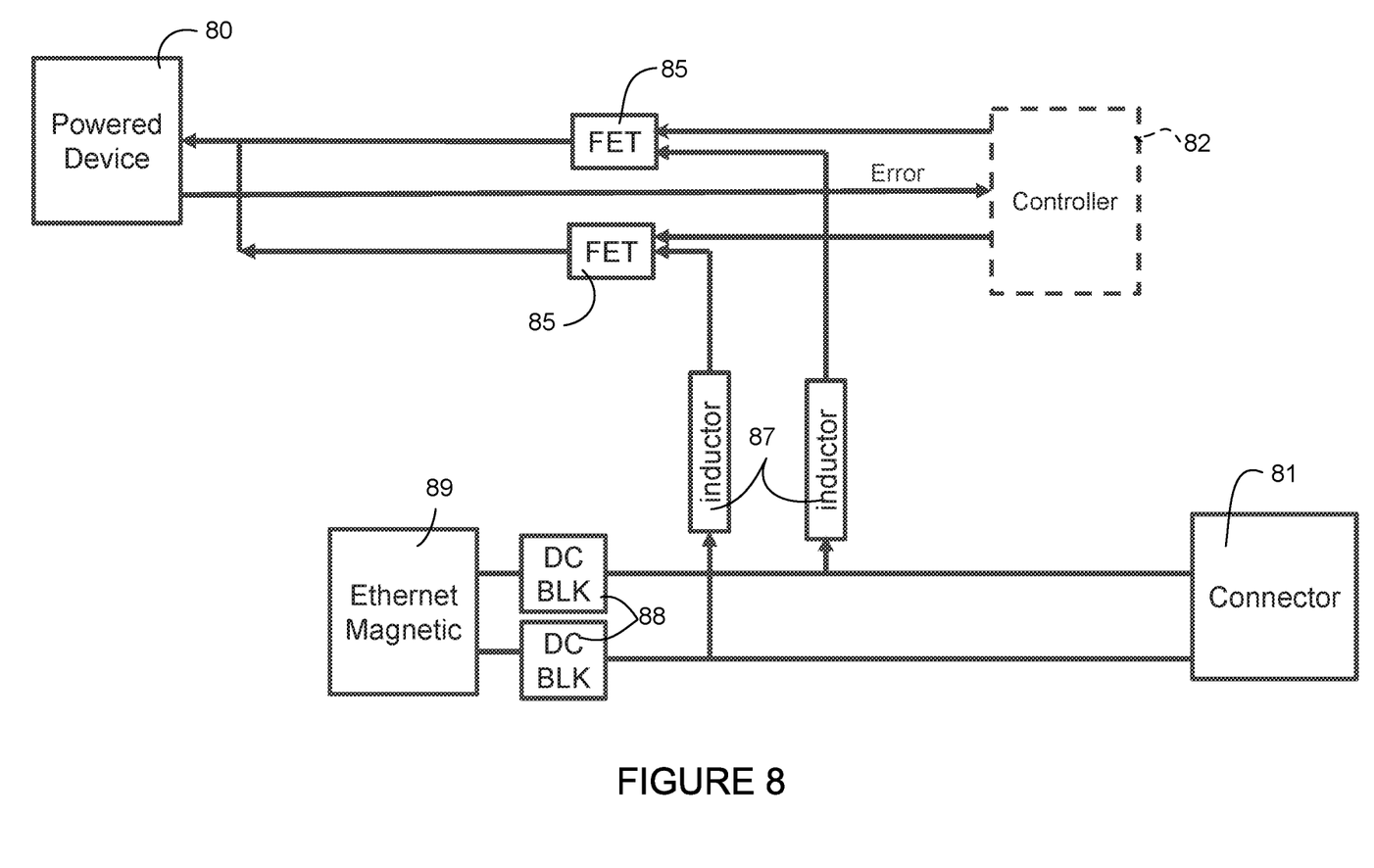
FIG. 8 is a block diagram of an electrical imbalance detection circuit for a powered device, in accordance with one embodiment.

FIG. 8 illustrates an example of a circuit for per pair fault and imbalance detection at a powered device 80 (e.g., line card 22 in FIG. 1), in accordance with one embodiment. As described above with respect to FIG. 7, the circuit is shown for only one of the four pairs for simplification. The powered device 80 receives power and data from the PSE through the connector 81 (e.g., RJ45 connector). Power is transmitted through inductors 87 and passes through field effect transistors (FETs) 85. A controller 82 (optional) compares the four pairs to check for an imbalance between pairs. The circuit in FIG. 8 may also be configured without intelligence (e.g., with controller 82 removed). In this case, error control is provided directly to the FETs 85 from the PD 80 (instead of to the controller). The Ethernet portion of the circuit includes Ethernet magnets 89 and DC blocks 88, as previously described.

As previously noted, the system may also check the wires for short circuit and provide fault protection for life safety by analyzing each wire in the cable system within a time period of 10 ms, which is known not to interfere with human health. In one embodiment, the system uses a control loop to evaluate wire stability at a periodic interval (e.g., 9 ms, 10 ms). In one example, a safety algorithm loops within a 10 ms window. Each wire is monitored for line abnormalities such as shorts and opens at the PSE. Voltage is measured and if there is no error, the loop is repeated. All wires are powered and at time n a first wire (n) is de-energized. In one example, the system cuts power on wire 1 for 0.25 ms or less and evaluates power to zero time. The system may wait 1.00 ms, for example (wait time contributes to keep average current higher without burst), and then loops to the next wire. Fall time is monitored and calculated based on wire gauge modeled to wire length maximum/minimum range. The wire may also be driven negative to force a shorter monitor time. At time (n)+0.25 ms, a next wire is energized. Rise time is monitored and calculated to wire gauge modeled to wire length maximum/minimum range. This process continues until all wires are checked. In this example, the total process takes 10 ms.

Figure 9:
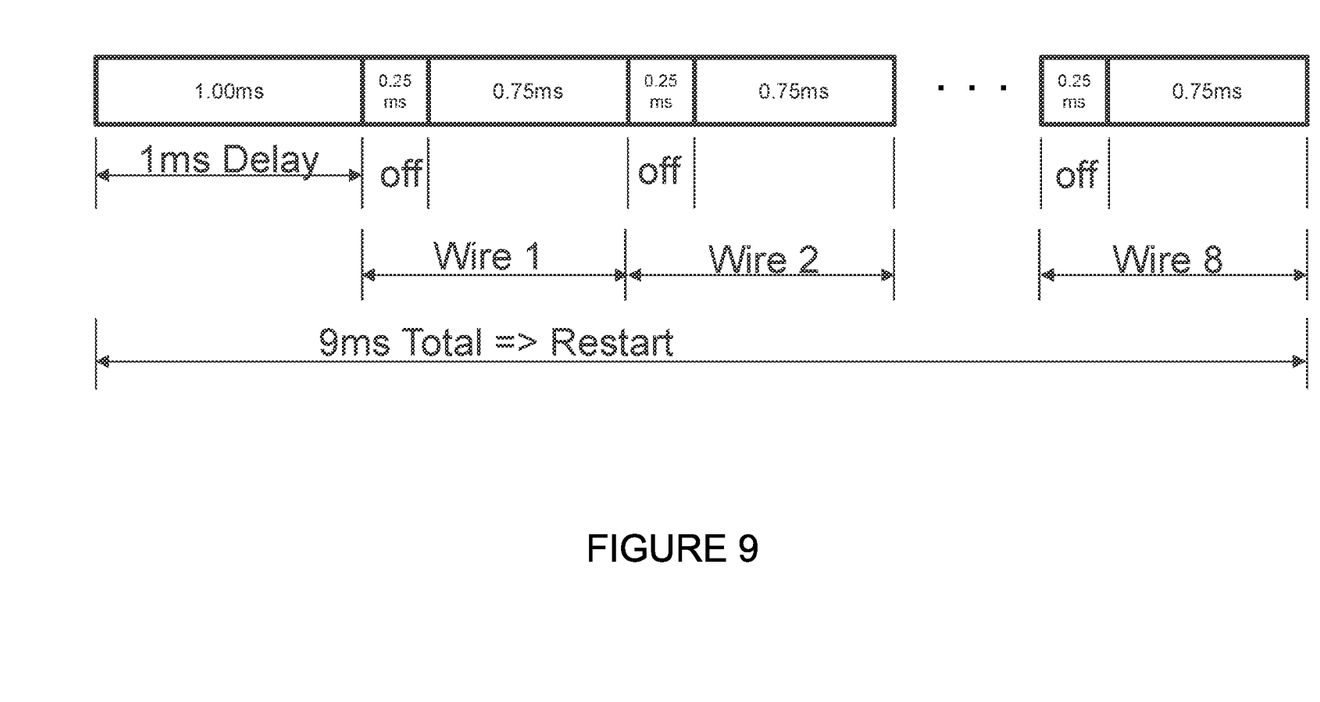
FIG. 9 illustrates a wire verification process, in accordance with one embodiment.

FIG. 9 illustrates another example, in which each wire is tested after a 1 ms delay. Wire 1 is turned off for 0.25 ms followed by a 0.75 ms delay to evaluate power drop. This process is repeated for all eight wires, resulting in a 9 ms cycle.

The safety algorithm described above may introduce a repetitive frequency base that may result in both low frequency radiated emissions and high range conducted emissions. The following algorithms may be deployed to make the safety mechanism more randomly distributed and avoid this repetitive frequency base.

In order to eliminate EMC (electromagnetic compatibility) spectral peaking, the algorithm varies the wire_x time span shown in FIG. 9 as 0.25 ms+0.75 ms=1.00 ms. Two random numbers may be generated; one number selects the wire_x to target (integer 1-8) and the other number selects the delay time to the next wire_x (0.1 ms-0.75 ms). This results in each off time location being distributed across the 9 ms window, as defined within the standard 10 ms safety evaluation time window.

It is to be understood that the above described process and time intervals used in the fault detection process are only examples and that the process may include different time intervals or algorithms, without departing from the scope of the embodiments.

The embodiments operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT), Internet, intranet, or any other network).

Figure 10:
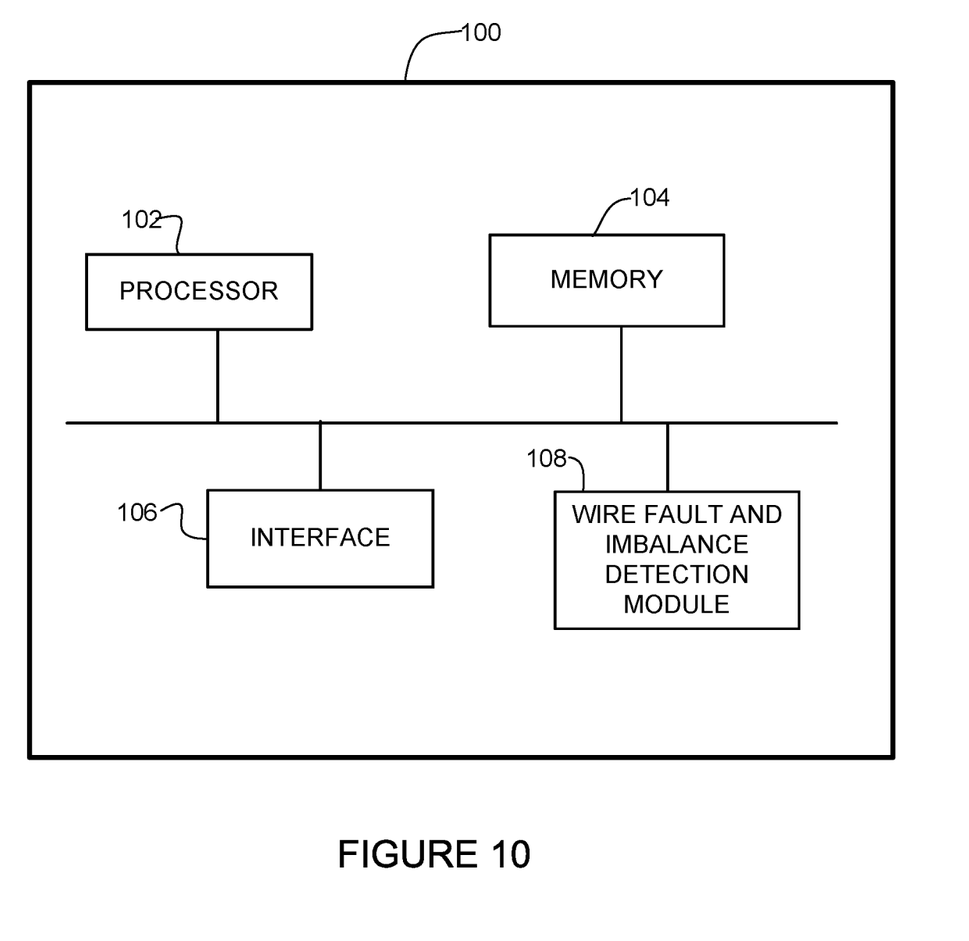
FIG. 10 depicts an example of a network device useful in implementing embodiments described herein.

FIG. 10 illustrates an example of a network device 100 (e.g., transport system, route processor card chassis in FIG. 1) that may be used to implement the embodiments described herein. In one embodiment, the network device 100 is a programmable machine that may be implemented in hardware, software, or any combination thereof. The network device 100 includes one or more processors 102, memory 104, interface 106, and wire fault and pair imbalance detection module 108.

Memory 104 may be a volatile memory or non-volatile storage, which stores various applications, operating systems, modules, and data for execution and use by the processor 102. For example, components of the wire fault and imbalance detection module 108 (e.g., code, logic, or firmware, etc.) may be stored in the memory 104. The network device 100 may include any number of memory components.

The network device 100 may include any number of processors 102 (e.g., single or multi-processor computing device or system), which may communicate with a forwarding engine or packet forwarder operable to process a packet or packet header. The processor 102 may receive instructions from a software application or module, which causes the processor to perform functions of one or more embodiments described herein.

Logic may be encoded in one or more tangible media for execution by the processor 102. For example, the processor 102 may execute codes stored in a computer-readable medium such as memory 104. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described above with respect to the flowchart of FIG. 6 or other functions such as power level negotiations or safety subsystems described herein. The network device 100 may include any number of processors 102.

The interface 106 may comprise any number of interfaces or network interfaces (line cards, ports, connectors) for receiving data or power, or transmitting data or power to other devices. The network interface may be configured to transmit or receive data using a variety of different communications protocols and may include mechanical, electrical, and signaling circuitry for communicating data over physical links coupled to the network or wireless interfaces. For example, line cards may include port processors and port processor controllers. The interface 106 may be configured for PoE, enhanced PoE, PoE+, UPoE, or similar operation.

The wire fault and imbalance detection module 108 may comprise hardware or software for use in fault detection described herein.

It is to be understood that the network device 100 shown in FIG. 10 and described above is only an example and that different configurations of network devices may be used. For example, the network device 100 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A method comprising:
  transmitting power in a power and data distribution system comprising at least two pairs of wires;
  negotiating a power level between Power Sourcing Equipment (PSE) and a Powered Device (PD) in the power and data distribution system;
  transmitting the power at the power level;
  periodically checking each of the wires for a fault comprising monitoring power fall time when a first wire is deenergized and monitoring power rise time when the first wire is energized; and
  checking for an electrical imbalance at the wires.

2. The method of claim 1 wherein checking for an electrical imbalance comprises checking for an electrical imbalance between said pairs of wires.

3. The method of claim 1 wherein checking for an electrical imbalance comprises checking for an electrical imbalance between the wires.

4. The method of claim 1 further comprising tracking current change to identify thermal buildup.

5. The method of claim 1 wherein the power and data distribution system comprises a Power over Ethernet (PoE) distribution system, and wherein the PSE comprises a route processor and the PD comprises a line card.

6. The method of claim 1 wherein periodically checking for each of the wires of the two pairs of wires.

7. The method of claim 1 wherein checking for an electrical imbalance comprises comparing the pairs of wires.

8. The method of claim 1 wherein the PSE has an output voltage between 56 volts and 58 volts.

9. The method of claim 1 further comprising monitoring current disparity and impedance changes.

10. The method of claim 1 wherein periodically checking each of the wires comprises evaluating wire stability at least once within a time period of 10 milliseconds.

11. The method of claim 6 further comprising generating random numbers for use in selecting a wire to check and a delay time between checking the wires.

12. The method of claim 10 further comprising cutting the power to one wire of the wires for at least 0.25 milliseconds and evaluating the one wire and repeating for each of the wires of the at least two pairs of wires.

13. An apparatus comprising:
  a plurality of ports for delivering power and data to a plurality of powered devices;
  a controller operable to transmit the power at a power less than 100 watts at startup, negotiate a power level with each of the plurality of powered devices, and transmit the power to at least one of the plurality of powered devices after negotiation of said power level; and
  a fault detection module for checking wires at each of the plurality of ports for a fault by monitoring power fall time when a first wire at each port is deenergized and monitoring power rise time when the first wire is energized, and checking for an electrical imbalance at wires delivering the power and data.

14. The apparatus of claim 13 wherein checking for an electrical imbalance comprises checking for an electrical imbalance between pairs of wires at the plurality of ports and between the wires.

15. The apparatus of claim 13 wherein the fault detection module is operable to initiate a renegotiation of a power level with one of the powered devices upon identifying a cable temperature within a percentage of a temperature limit.

16. The apparatus of claim 13 wherein the power and data are transmitted on at least two pairs of wires and wherein the controller is operable to compare pairs of the wires to check for said electrical imbalance.

17. A modular transport system comprising:
  Power Sourcing Equipment (PSE) comprising a plurality of ports for delivering power and data; and
  a plurality of powered devices comprising a plurality of ports for receiving the power and data;
  wherein the PSE comprises a fault detection system for checking wires at each of the plurality of ports for a fault by monitoring power fall time when a first wire at each port is deenergized and monitoring power rise time when the first wire is energized, and checking for an electrical imbalance at the wires, and a controller operable to transmit the power at a power less than a predetermined power level at startup, negotiate a power level with each of the plurality of powered devices, and transmit the power at a power level greater than the predetermined power level to at least one of the plurality of powered devices after negotiation of said power level and passing checks performed by the fault detection system.

18. The modular transport system of claim 17 wherein the PSE comprises at least two route processors and the powered devices comprise line cards or fabric cards.

19. The modular transport system of claim 17 wherein passive coupling is used for data transfer and inductors are used to deliver power with matched power inductors.

20. The modular transport system of claim 18 further comprising an extended power system for increasing a power capacity of the route processors.

* * * * *